United States Patent [19]
Ritland et al.

[11] Patent Number: 5,676,907
[45] Date of Patent: Oct. 14, 1997

[54] METHOD FOR MAKING NEAR NET SHAPE CERAMIC-METAL COMPOSITES

[75] Inventors: Marcus A. Ritland, Golden; Dennis W. Readey, Lakewood; James E. Stephan, Arvada; Dean A. Rulis, Littleton; Jack D. Sibold, Golden, all of Colo.

[73] Assignee: Coors Ceramics Company, Golden, Colo.

[21] Appl. No.: 220,560

[22] Filed: Mar. 31, 1994

Related U.S. Application Data

[63] Continuation-in-part of PCT/US93/08835, Sep. 17, 1993, which is a continuation-in-part of Ser. No. 946,972, Sep. 17, 1992, abandoned.

[51] Int. Cl.$^6$ .................. B28B 1/24; B05D 3/02
[52] U.S. Cl. .......... 264/643; 427/314; 427/398.1; 264/638; 264/645; 264/667; 264/670
[58] Field of Search .......... 264/60, 62; 164/98, 164/100, 103; 427/314, 431, 432, 443.2, 398.1

[56] References Cited

U.S. PATENT DOCUMENTS

| | | | |
|---|---|---|---|
| 2,612,443 | 9/1952 | Goetzel et al. | 419/27 |
| 3,310,427 | 3/1967 | Cheney et al. | 427/319 |
| 3,864,154 | 2/1975 | Gazza et al. | 29/123 B |
| 3,868,267 | 2/1975 | Gazza et al. | 117/22 |
| 3,928,662 | 12/1975 | Kaneko et al. | 427/294 |
| 3,949,804 | 4/1976 | Kaneko et al. | 164/62 |
| 4,108,672 | 8/1978 | Klug et al. | 106/38.9 |
| 4,164,424 | 8/1979 | Klug et al. | 106/38.9 |
| 4,824,622 | 4/1989 | Kennedy et al. | 264/59 |
| 4,828,008 | 5/1989 | White et al. | 164/66.1 |
| 4,849,266 | 7/1989 | Dwivedi et al. | 428/34.4 |
| 4,853,352 | 8/1989 | Newkirk et al. | 501/88 |
| 4,868,143 | 9/1989 | Newkirk et al. | 501/127 |
| 4,988,645 | 1/1991 | Holt et al. | 501/91 |
| 5,000,246 | 3/1991 | Dwivedi et al. | 164/97 |
| 5,004,035 | 4/1991 | Burke et al. | 164/97 |
| 5,005,631 | 4/1991 | Dwivedi | 164/97 |
| 5,007,475 | 4/1991 | Kennedy et al. | 164/97 |
| 5,016,703 | 5/1991 | Aghajanian et al. | 164/97 |
| 5,017,533 | 5/1991 | Newkirk et al. | 501/127 |
| 5,040,588 | 8/1991 | Newkirk et al. | 164/97 |
| 5,267,601 | 12/1993 | Dwivedi | 164/97 |

OTHER PUBLICATIONS

"Interface Reactions Between Metals and Ceramics: IV, Wetting of Sapphire by Liquid Copper–Oxygen Alloys", A.C.D. Chaklader, A.M. Armstrong, and S.K. Misra, Dept. of Metallurgy, Univ. of British Columbia, Vancouver, British Columbia, Canada (Date and publication unknown).

"The Infiltration of Aluminum into Silicon Carbide Compacts", P.B. Maxwell, G.P. Martins, D.L. Olson, and G.R. Edwards, Jun. 1990, Metallurgical Transactions B, vol. 21B., pp. 475–485.

"Modeling of Infiltration Kinetics for Liquid Metal Processing of Composites" G.P. Martins, D.L. Olson, and G.R. Edwards, Feb. 1988, Metallurgical Transactions B, vol. 19B., pp. 95–101.

"Wettability of Solids by Liquid Metals", Yu Naidich, 1981, Prog. in Surf & Membrane Sc., pp. 353–485.

"Effect of Oxygen on the Reaction Between Copper and Sapphire", T.E. O'brien and A.C.D. Chaklader, Journal of the American Ceramic Society, vol. 57, 1974, pp. 329–332.

"Infiltration Mechanisms and Kinetics of Liquid Aluminum", J.D. Seitz, G.R. Edwards, G.P. Martins, and P.Q. Campbell, 1989, Interfaces in Metal–Ceramaics Composites, The Minerals, Metals and Materials Society, pp. 197–212.

*Primary Examiner*—Christopher A. Fiorilla
*Attorney, Agent, or Firm*—Sheridan Ross

[57] ABSTRACT

A process for fabricating ceramic-metal composites having continuous ceramic and metallic phases. The process includes the steps of contacting a porous ceramic matrix material having the general shape of an article of manufacture with molten metal whereby capillary action pulls the metal into the open porosity of the ceramic matrix to substantially fill the open void space. The present invention also provides a ceramic-metal composite having continuous metal and ceramic phases.

21 Claims, 3 Drawing Sheets

METHOD FOR MAKING NEAR NET SHAPE CERAMIC-METAL COMPOSITES

This application is a continuation-in-part of PCT Application Ser. No. PCT/US93/08835, filed Sep. 17, 1993, which is a continuation-in-part of U.S. patent application No. 07/946,972, filed Sep. 17, 1992, now abandoned.

BACKGROUND OF THE INVENTION

1. Field of the Invention

The present invention relates to ceramic-metal composite materials, or cermets, and methods of producing such composites. More particularly, the present invention relates to a method for producing ceramic-metal composites by spontaneously infiltrating a metal into a porous ceramic preform having substantially the same shape as the final composite and the composites produced thereby.

2. Description of Related Art

During the last few decades, ceramics have been investigated for use in many structural applications, particularly in high temperature environments. However, ceramic materials are not always well suited since they are brittle, have a limited ductility and low values of fracture toughness at low temperatures. In addition, the fracture strength of ceramics is not very reproducible since the average strength usually varies from one lot of parts to the next, which is attributed to the presence of processing flaws which can initiate fractures. A great deal of effort has been expended in an attempt to increase the fracture reliability of ceramic materials and to develop tough and creep-resistant ceramic composites.

One possible solution is the fabrication of a ceramic-metal composite, also commonly referred to as a cermet. Traditionally, ceramic metal composites have been produced in one of two ways; (1) by heating mixtures of ceramic and metal materials to obtain a metal matrix having a discrete ceramic phase, or (2) as disclosed in U.S. Pat. No. 2,612,443 by Goetzel at al., issued Sep. 30, 1952, by forming a sintered porous body that can be a metal, metal-carbide or metal-nitride, and infiltrating the porous body with a molten metal by the use of mechanical squeeze-casting or other means of applying pressure to force the molten metal into the voids within the porous body.

Other approaches for forming cermets have been used due to a lack of success in obtaining adequate control of cermet composition and form with traditional processes. For example, use of accelerated oxidation reactions and "combustion wave" exothermic reaction processes have been utilized to form cermets. See, for example, U.S. Pat. No. 4,988,645 by Holt et al., issued Jan. 29, 1991.

The LANXIDE process, such as that disclosed in U.S. Pat. No. 4,853,352 by Newkirk et al., issued Aug. 1, 1989, relates to a method for forming cermets whereby a molten parent metal is oxidized, usually in the presence of oxidation enhancing dopants, to create a three-dimensional interconnected ceramic-metal composite material which contains between 1% and 40% of the parent metal by volume. This process is limited in that only the parent metal is infiltrated into the oxide reaction product and the process takes extended periods of time, such as 48 hours or more.

Infiltration of molten metals into porous ceramic preforms by squeeze casting and by applying pressure to the molten metal is known, for example, see Verma and Dorcic, "Performance Characteristics of Metal-Ceramic Composites Made by the Squeeze Casting Process", *Ceramic Engineering Science Proc.*, Vol. 9, pp. 579–596 (1988). However, it is difficult to achieve near complete infiltration of the void space within the preforms without use of substantial pressure. In addition, when ceramic preform materials contain a high volume of porosity, the use of pressure in squeeze casting techniques can crumble the ceramic structure. The use of pressure can also preclude the formation of metal-matrix composites having complex shapes. Further, these processes require complex pressure dies and frequently require extensive flash removal, that is, removal of excess metal.

Infiltration using vacuum furnaces and using infiltration enhancers are also described in the art. U.S. Pat. No. 3,864,154 by Gazza et al., issued Feb. 4, 1975, discloses a method for the infiltration of aluminum or silicon into a cold-pressed compact of boron-containing ceramics (e.g., aluminum boride or silicon boride) in a vacuum furnace. It is disclosed that the infiltration process takes about 2 hours.

U.S. Pat. No. 4,828,008 by White et al. issued on May 9, 1989. White et al. disclose a method for infiltrating aluminum alloys into a permeable mass of loose ceramic powder, such as alumina. A nitrogen gas atmosphere must be used and magnesium must be alloyed into the aluminum metal to achieve spontaneous infiltration. U.S. Pat. No. 5,016,703 by Aghajanian et al. and issued on May 21, 1991, discloses a process for the spontaneous infiltration of aluminum into a ceramic preform that comprises a mass of particles, platelets, whiskers or fibers. An infiltration enhancer, such as magnesium turnings, is placed between the molten metal and the preform to enhance the infiltration. The infiltration time is on the order of about 5 hours.

U.S. Pat. No. 5,004,035 by Burke et al. issued Apr. 2, 1991, discloses the use of infiltration enhancers for infiltrating aluminum alloys into alumina or silicon carbide preforms that comprise loose particles of materials such as alumina or silicon carbide. After infiltration, which can take on the order of about 10 hours, the metal composite can be reheated and worked to vary the properties of the composite.

U.S. Pat. No. 5,017,533 by Newkirk et al. issued on May 21, 1991. Newkirk et al. disclose a method for producing a self-supporting ceramic body by oxidation of a molten precursor metal with a vapor-phase oxidant to form an oxidation reaction product. A second metal is incorporated into the molten flux during the oxidation reaction. For example, copper can be alloyed into aluminum which is then oxidized to form an alumina oxidation product. The oxidation process takes on the order of 48 hours or more.

U.S. Pat. No. 5,007,475 by Kennedy et al. issued on Apr. 16, 1991. Kennedy et al. disclose the formation of a metal matrix composite body by the spontaneous infiltration of a molten matrix metal into a three-dimensional interconnected material. The metal is an aluminum alloy and the three-dimensional matrix is preferably alumina. The aluminum alloy is placed on top of the three-dimensional interconnected material and the assembly is placed in a containing vessel, which is then heated to infiltrate the metal into the three-dimensionally interconnected material. The typical infiltration time is on the order of about 7 hours or more.

U.S. Pat. No. 4,868,143 by Newkirk et al. and issued on Sep. 19, 1989, discloses a process for making a composite wherein an oxidation reaction product (e.g., alumina) is formed with aluminum parent-metal interconnected therethrough. The composite is then contacted with a second molten metal such as copper or nickel which penetrates the interconnected parent metal by interdiffusion. The resulting product is a composite having a mixture of two metals interconnected throughout the composite. U.S. Pat. No. 5,267,601 by Dwivedi, issued on Dec. 7, 1993, discloses a process wherein a permeable mass is formed into a preform having a cavity. The preform is placed into contact with the molten matrix metal such that an infiltrating atmosphere can communicate with the cavity in the preform in order to obtain spontaneous infiltration of the molten matrix metal. It is disclosed that a metal matrix can be produced having substantially the same geometry as the preform. However, extended periods of time (e.g., 25 to 100 hours) are used to complete infiltration and the preform is only infiltrated to the level that the preform is immersed in the molten metal.

There exists a need for a simple and inexpensive process to form ceramic metal composites. It would be particularly advantageous if such ceramic metal composites could be formed using a process that is fast and produces substantially dense and non-porous composites that include substantially continuous metal and ceramic phases. It would also be advantageous if the resulting composite had substantially the same shape as the ceramic matrix preform to minimize or eliminate subsequent machining steps.

SUMMARY OF THE INVENTION

The present invention is generally directed to a method for making ceramic-metal composite materials substantially having the shape of the ceramic preform used to form the composite. The present invention provides a method of infiltrating such a preform with a metal which spontaneously infiltrates the ceramic preform, preferably in the absence of overpressure to assist the infiltration.

According to one aspect of the present invention, a method for making a near-net shape ceramic-metal composite article of manufacture is provided. The method can include the steps of forming a sintered ceramic body having at least about 5 volume percent open porosity and having the general shape of a selected article of manufacture, placing a metal into a refractory vessel adapted to contain the metal, heating the metal contained in the vessel to a temperature in excess of the melting temperature of the metal to form a pool of metal having a top surface, contacting a portion of the sintered ceramic body with the top surface of the molten metal under conditions such that the molten metal spontaneously infiltrates substantially all of the open porosity in the sintered ceramic body by capillary action and cooling the infiltrated ceramic body to form a metal-infiltrated article of manufacture.

According to certain aspects of this invention, the metal can be a copper metal and the sintered ceramic body can be alumina. The metal can include infiltration additives, such as titanium or oxygen. Preferably, the sintered ceramic body includes a substantially uniform sintered ceramic body without any cavities. The article of manufacture made by the method according to this invention can preferably be selected from a variety of articles, including a lock component, turbine blade, a seal face, a gear, an electrical contact, a valve body, or similar articles. The metal can preferably be selected from the group of brass, bronze, copper, and nickel alloys. The contacting step can include contacting the sintered ceramic body with the molten metal for less than about 1 hour and more preferably less than about 15 minutes. The contacting step preferably occurs in the absence of substantial overpressure and can preferably occur in a vacuum atmosphere. The sintered ceramic body can have from about 10 volume percent to about 90 volume percent open porosity. In one embodiment, the sintered ceramic is formed by vapor phase sintering. In another embodiment, the sintered ceramic is formed by injection molding a green body and bisque firing the green body.

Another aspect of the present invention is directed to a method for making a near-net shape ceramic-metal composite article of manufacture that includes the steps of placing a metal into a refractory vessel adapted to contain the metal, heating the metal contained in the refractory vessel to a temperature of at least the melting temperature of the metal to form a molten metal, contacting a sintered ceramic preform having the general shape of a desired article of manufacture and having from about 10 volume percent to about 90 volume percent open porosity with the molten metal under substantially no overpressure wherein capillary action wicks the molten metal into substantially all of said open porosity and cooling the infiltrated ceramic preform to form a ceramic-metal composite article of manufacture.

According to certain embodiments of this aspect of the invention, the article of manufacture is a lock component. According to another embodiment, the article of manufacture is a turbine blade. Preferably, the sintered ceramic is heated to a temperature of at least about the temperature of the molten metal during the contacting step.

DESCRIPTION OF PREFERRED EMBODIMENTS

Figure 1:
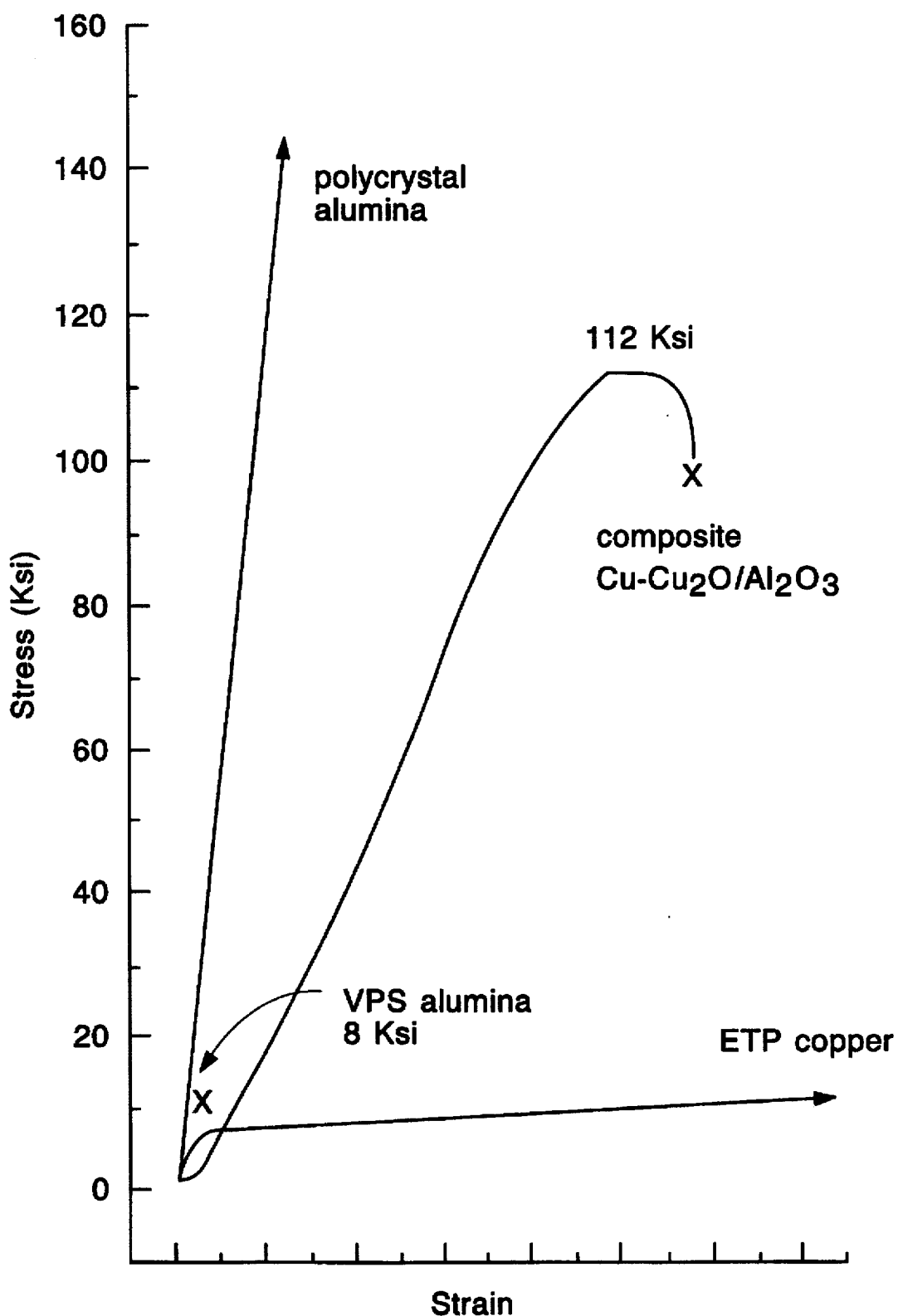
FIG. 1 illustrates a compression stress-strain diagram comparing a composite produced according to the present invention with the component materials of the composite.

The present invention is directed to a method for making a ceramic-metal composite material with interconnecting and substantially continuous ceramic and metal phases, wherein the composite is made from a ceramic preform having a shape that is substantially similar to the desired ceramic-metal composite article. The composite is formed by infiltrating molten metal into a porous ceramic body having a substantially interconnected and continuous pore structure referred to as open porosity. The infiltration is preferably accomplished in the absence of significant overpressures and the ceramic is infiltrated by capillary action. Substantially all of the open porosity can be infiltrated, if desired.

According to the present invention, the ceramic matrix material is selected to be compatible with the infiltrant metal. That is, it is preferred that the ceramic matrix is capable of being wetted and infiltrated by the molten metal without the use of any substantial overpressure. It is more preferred that, at the temperature of infiltration, the ceramic matrix is wet by the molten metal. Complete wetting of the ceramic matrix by the molten metal will enhance the spontaneous infiltration of the metal into the ceramic matrix without the use of substantial overpressure to force the metal into the ceramic matrix.

Among the preferred ceramic matrix materials are the sintered ceramic oxides, carbides and nitrides. In a preferred embodiment, a sintered oxide ceramic is selected from the group of alumina ($Al_2O_3$), aluminum titanate ($Al_2TiO_5$), nickel oxide (NiO), or magnesium oxide (MgO) ceramic.

The ceramic matrix is a sintered matrix that comprises a substantially continuous ceramic phase. In addition to the primary ceramic oxide, the sintered ceramic can include other materials, such as sintering aids (e.g., $SiO_2$). Sintered aluminum titanate, for example, can also include additives, such as $SiO_2$ or $Fe_2O_3$, which can be added to aluminum titanate as stabilizers. In addition to the above-described oxides, non-oxide ceramics such as silicon carbide (SiC) or silicon nitride ($Si_3N_4$) can be used in some applications.

The ceramic matrix is a sintered matrix that has a substantially continuous ceramic phase. The sintered ceramic has an identifiable shape and a free-standing form in the absence of constraining supports. This is to be distinguished from a vessel filled with loose or lightly packed particles or fibers of material. One of the advantages of using a cohesive sintered ceramic matrix is that the cohesive sintered ceramic matrix can be prefabricated into the shape of a selected article of manufacture (a preform). Further, the cohesive sintered ceramic matrix can be gripped by one portion (e.g. a top portion) while another portion of bottom port(e.g. a bottom portion) is contacted with the molten metal. The molten metal will then infiltrate by capillary action into substantially all of the open porosity of the ceramic, including those portions not immersed in the molten metal.

The ceramic matrix material is a sintered, coherent body that has an open and substantially continuous pore structure to facilitate the infiltration of molten metal into the matrix without the use of any substantial overpressure to force the metal into the matrix. As used herein, the term "substantial overpressure" refers to pressure in excess of about 3 atmospheres (about 45 psi) applied during the infiltration process, either mechanically or through the use of pressurized gas.

The total open porosity in the ceramic matrix must be at least about 5 volume percent, and is preferably from about 10 volume percent to about 90 volume percent. More preferably, the open porosity is from about 15 volume percent to about 80 volume percent of the sintered ceramic matrix. The average pore size of the open porosity is preferably from about 1 micrometer to about 10 micrometers, however, it is not believed that the average pore size is critical to the practice of the present invention. Porous ceramics having open and continuous porosity as described above can be formed in a number of ways.

For example, a green body comprising a ceramic powder can be formed and sintered in an enhanced vapor phase sintering process to form a porous body having a substantially continuous and interconnected pore structure. The total porosity and average pore size of the sintered ceramic matrix can be controlled by controlling the porosity of the green body and the sintering conditions. Vapor phase sintering is a convenient process to produce porous ceramics having controlled porosities and pore sizes. As such, the porous ceramics form suitable matrices for infiltration with molten metals to produce ceramic-metal composites having interpenetrating three-dimensional structures.

In the vapor phase sintering process, a green body is formed from ceramic powder. The starting particle size is not critical to the practice of the present invention, however, a smaller average particle size can be used to produce a sintered body having a lower average pore size.

It may be desirable to form agglomerates of the powder as a means of controlling the porosity of the green body formed from the powder. For example, aluminum hydroxide (Al(OH)$_3$) or aluminum sulfate (Al$_2$(SO$_4$)$_3$) particles having a diameter of about 50 micrometers can be calcined to form alumina agglomerates that have a porosity of about 50 volume percent. If these agglomerates are then formed into a body with about 50 volume percent packing, the net result will be about 75 volume percent porosity. The agglomerates can also be formed with additional powder to produce green bodies with a wider range of porosity than can be obtained with milled powder alone.

After ceramic powder having a desired particle size range has been obtained, the powder can be formed into a green body. As used herein, the term green body refers to an unsintered body of ceramic powder.

For example, the powder can be uniaxially pressed into a green body at a pressure of from about 48 MPa to about 69 MPa (7 ksi to 10 ksi) or isostatically pressed at similar pressures. In addition, forming additives can be used to improve the mechanical strength of the green body formed by pressing the ceramic powder. Additives can include binders such as polyvinyl alcohol, plasticizers such as polyethylene glycol, and lubricants such as aluminum stearate.

Other forming methods such as injection molding, extrusion, slip casting and similar processes can be used to form green bodies according to the present invention. Such methods are particularly advantageous when the sintered ceramic matrix will be a preform of complex shape that is to be infiltrated with a molten metal. Techniques such as injection molding are useful for fabricating articles having intricate and complex structures having a near-net shape.

Further, some green bodies with high levels of forming additives may have sufficient strength to enable the green body to be machined. Thus, intricate parts may advantageously be formed by machining processes while the piece is in the soft green state.

One method for controlling the total porosity of the sintered ceramic matrix formed by vapor phase sintering is to control the total porosity of the green body. This can be done, for example, by varying the pressing pressure. Typically, green bodies formed by uniaxially pressing finely-divided ceramic powder have porosities ranging from about 50 volume percent to about 65 volume percent. The total porosity can be increased to from about 70 volume percent to about 80 volume percent by using agglomerated powder, as is discussed hereinabove.

After forming, the green body can be sintered to obtain a sintered ceramic body. If organic binders or other organic materials are used in the green body forming process, these additives can advantageously be removed prior to fully sintering the ceramic powder. This is commonly referred to as "binder burnout." For example, the green body can be placed in a furnace and slowly heated to a temperature of, for example, about 600° C. to volatilize organic additives. Since these organic additives comprise a large amount of carbon, it is usually preferable to volatilize these materials under a flowing gas such as oxygen.

The green body can be presintered prior to vapor phase sintering. Presintering is a convenient and economical method of controlling the total porosity of the final sintered body. Presintering conveniently lowers the porosity of the green body to a range that is desirable for the sintered body, since the vapor phase sintering technique does not substantially affect the total porosity of the sintered body.

Preferably, the presintering step is done at a temperature that is slightly below the normal solid-state sintering temperature of the ceramic material. For example, alumina can be presintered at a temperature of from about 1300° C. to about 1600° C., more preferably from about 1450° C. to about 1550° C. The optimum temperature and sintering time will depend on the particle size of the starting powder or agglomerates. The sintering atmosphere is not critical and, therefore, air is preferred. However, certain atmospheres may be undesirable due to reactions between the atmosphere and the ceramic material at the presintering temperature. The presintering step preferably produces a presintered body having a total porosity of from about 10 percent to about 70 percent. The total porosity can be controlled by varying the time at the presintering temperature, such as from about 1 minute to about 300 minutes. The presintering step can determine the total porosity of the final sintered body, however, presintering may not be necessary if the green body has the desired total porosity for the final sintered product. The presintered body may advantageously be machined to its appropriate final shape and dimensions.

The presintered or green ceramic body is then vapor phase sintered to maintain control over the total porosity and average pore size of the sintered body and form a porous sintered ceramic.

Enhanced vapor phase sintering has been studied for some ceramic materials. According to this process, volatile transport gases at a high partial pressure are produced during sintering. Preferably, the partial pressure of the transport gas is at least about $10^{-4}$ atm at the sintering temperature and more preferably at least about $10^{-3}$ atm. It has been found that for some ceramic materials, the vapor phase sintering process may be enhanced by the presence of a reaction gas or a material that produces such a gas, particularly a gas comprising a halide, in the sintering atmosphere. For example, vapor phase sintering of magnesia can be enhanced by the addition of hydrogen chloride (HCl) gas:

$$MgO_{(s)}+2HCl_{(g)} \rightleftharpoons MgCl_{2(g)}+H_2O_{(g)} \quad (1)$$

In one embodiment of the present invention, an alumina-containing body is sintered in the presence of hydrogen chloride gas (HCl), thereby promoting the reaction:

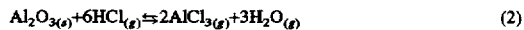

$$Al_2O_{3(s)}+6HCl_{(g)} \rightleftharpoons 2AlCl_{3(g)}+3H_2O_{(g)} \quad (2)$$

Alternatively, alumina may be sintered in the presence of hydrogen fluoride gas (HF) in which case the vapor phase transport occurs primarily via the process:

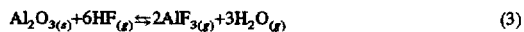

$$Al_2O_{3(s)}+6HF_{(g)} \rightleftharpoons 2AlF_{3(g)}+3H_2O_{(g)} \quad (3)$$

The reaction gas (e.g., HCl or HF) can be added to the sintering furnace directly in the form of commercially available bottled gas. In this embodiment, the gas should be dry and contain minimal residual moisture. Residual water ($H_2O$) can drive the reverse reaction and inhibit formation of the vapor transport species. Preferably, the partial pressure of the reaction gas is at least about 0.25 atm and is more preferably from about 0.4 atm to about 1 atm.

Alternatively, the gas may be formed in-situ within the sintering furnace. For example, aluminum fluoride ($AlF_3$) powder can be placed in a closed furnace. As the furnace is heated, hydrogen gas is added to the furnace to promote an in-situ reaction to form hydrogen fluoride gas over the alumina. This procedure is particularly advantageous when environmentally difficult gases such as hydrogen fluoride are used.

Sintering temperatures can vary depending on the ceramic material being sintered. For example, alumina powder is preferably sintered at a temperature from about 1400° C. to about 1600° C. to form a sintered ceramic body. The pore size and pore size distribution can be controlled by adjusting the amount of time that the body is sintered at the sintering temperatures. Table 1 lists the mean pore diameter for alumina compacts sintered at 1600° C. for varying amounts of time under 1 atm HCl. For each sample, the starting particle size was 1 micrometer and the porosity of the sample remained at about 50 volume percent regardless of the sintering time.

TABLE 1

| TIME | MEAN PORE SIZE |
|---|---|
| 10 min. | 2.1 microns |
| 80 min. | 3 microns |
| 250 min. | 4 microns |
| 1080 min. | 7.5 microns |

As Table 1 illustrates, as the sintering time increases, the average pore diameter also increases. However, the total porosity remains substantially constant.

The ceramic body may be sintered in any system in which the partial pressure of the reaction gas, and hence the transporting gas can be controlled. For example, a simple tube furnace having a sealed end with an inlet for the reaction gas may be used.

As an alternative to vapor phase sintering, it is known to those skilled in the art that the open porosity of a ceramic can be controlled by controlling variables such as the starting particle size of the ceramic powder, the composition of the ceramic powder and/or the sintering temperature. Specifically, ceramic powder having a larger average particle size, the absence of sintering aids in the composition and lower sintering temperatures can all produce a sintered ceramic body having open porosity.

For example, porous sintered alumina can be formed from alumina particles having an average particle size in the range of from about 0.5 micrometers to about 70 micrometers by forming the particles into a green body and sintering. The green body can be sintered at a temperature of from about 900° C. to about 1800° C. to form a porous sintered ceramic if the sintering temperature is somewhat below the normal sintering temperature for obtaining dense alumina. The absence of sintering aids, such as silica, will also increase the porosity of the ceramic.

Other methods for forming porous ceramics include the use of pore formers. Pore formers are materials which have a volatilization temperature that is lower than the sintering temperature of the ceramic. Thus, materials such as walnut shells or latex spheres can be added to the ceramic mix. Upon sintering, the material volatilizes, leaving behind open pore space. For example, aluminum titanate porous bodies can be produced by using pore-formers, particularly walnut shells.

As discussed above, it is preferable to obtain a ceramic matrix having an open porosity that is at least about 5 volume percent, preferably from about 10 volume percent to about 90 volume percent, and more preferably from about 15 volume percent to about 80 volume percent open porosity. The open porosity preferably has an average pore size of at least about 1 micrometer and more preferably from about 1 micrometer to about 10 micrometers.

When a porous ceramic matrix having the desired total porosity, pore size and shape is obtained, molten metal can be infiltrated into the open porosity of the ceramic matrix. In a preferred embodiment of the present invention, the ceramic matrix is brought into contact with the molten metal and the metal infiltrates the ceramic matrix by capillary action without the assistance of substantial overpressure. Thus, when contacted with the sintered ceramic, the molten metal enters the pore structure of the ceramic and fills substantially all of the open porosity or a selected portion of the open porosity.

According to a preferred embodiment of the present invention, a portion of the sintered ceramic body is contacted with the top surface of a molten pool of infiltrant metal for a time sufficient to infiltrate at least a portion of the sintered ceramic body. According to this embodiment, the infiltrant metal is placed in a refractory vessel and is heated to a temperature in excess of the melting temperature of the metal such that the metal is in the form of a molten pool having a top surface. Preferably, the metal is heated to a temperature that is sufficiently high to melt all constituents of the alloy and is high enough to yield a liquid metal with a low enough viscosity to permit infiltration in the absence of substantial pressure. For example, if oxygen is used as an infiltration additive, the temperature of the molten metal should be above the melting point of copper oxide, e.g., at least about 1230° C.

The sintered ceramic body is brought into contact with the molten metal and the molten metal infiltrates the open porosity of the ceramic and substantially fills the open porosity. The metal-infiltrated ceramic is then cooled to form the ceramic-metal composite having substantially continuous metal and ceramic phases. It is also possible to heat the composite in a reducing atmosphere to reduce any excess copper oxide to copper metal.

The pool of molten metal infiltrates the ceramic by capillary action which overcomes the forces of gravity and pulls the molten metal into the ceramic matrix. The advantage of using such a process is that the molten metal infiltrates the ceramic structure and no excess metal will flow out of the ceramic structure. Further, since capillary action is the driving mechanism for infiltrating the metal into the ceramic structure, the metal will infiltrate substantially all portions of the ceramic structure, regardless of the shape of the structure, without having to completely immerse the matrix into the molten metal. Further, the infiltrating metal can force out gas as the metal infiltrates so that little or no gas is trapped in the composite.

Figure 2:
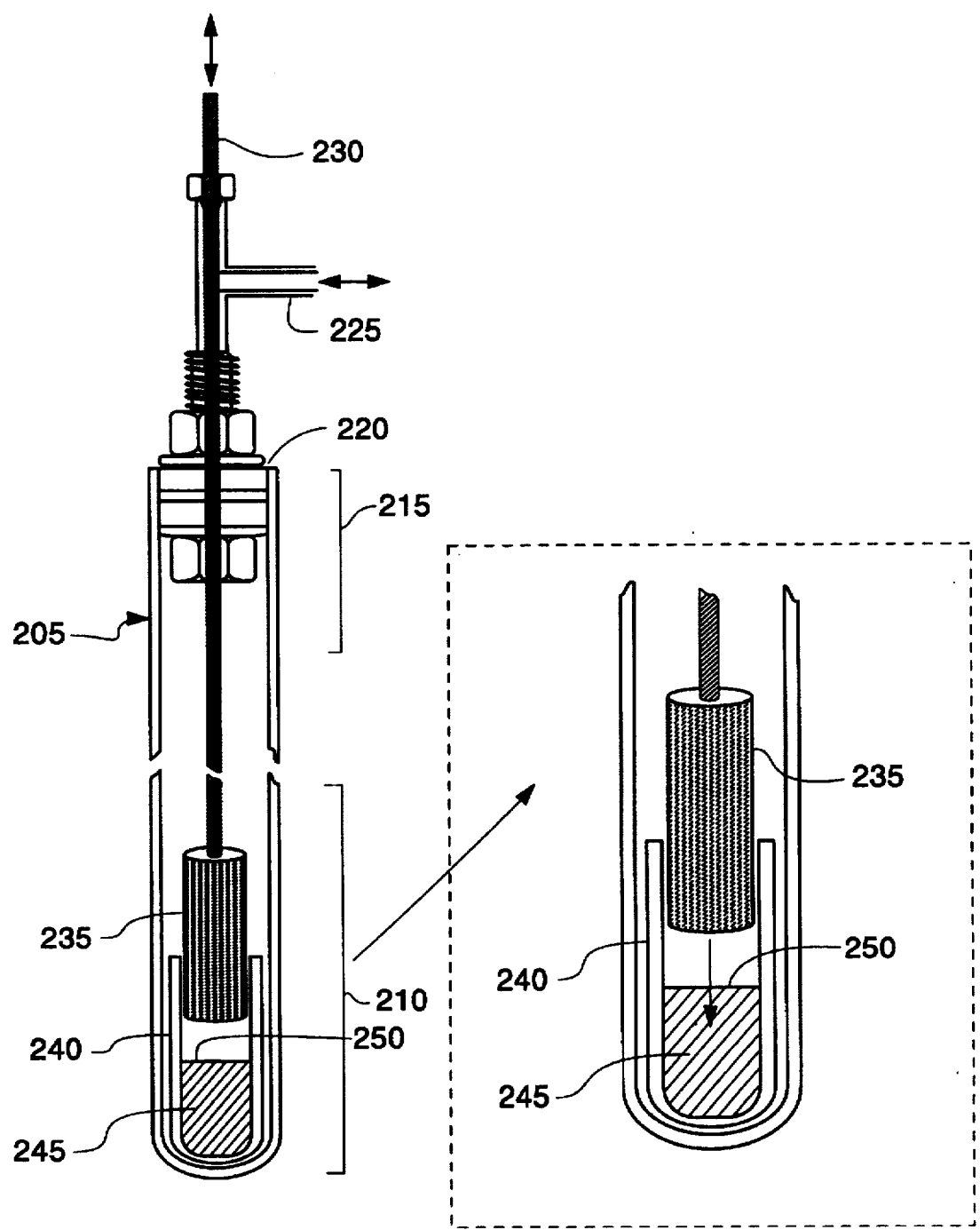
FIG. 2 illustrates an apparatus useful for carrying out a method according to one embodiment of the present invention.
Figure 3:
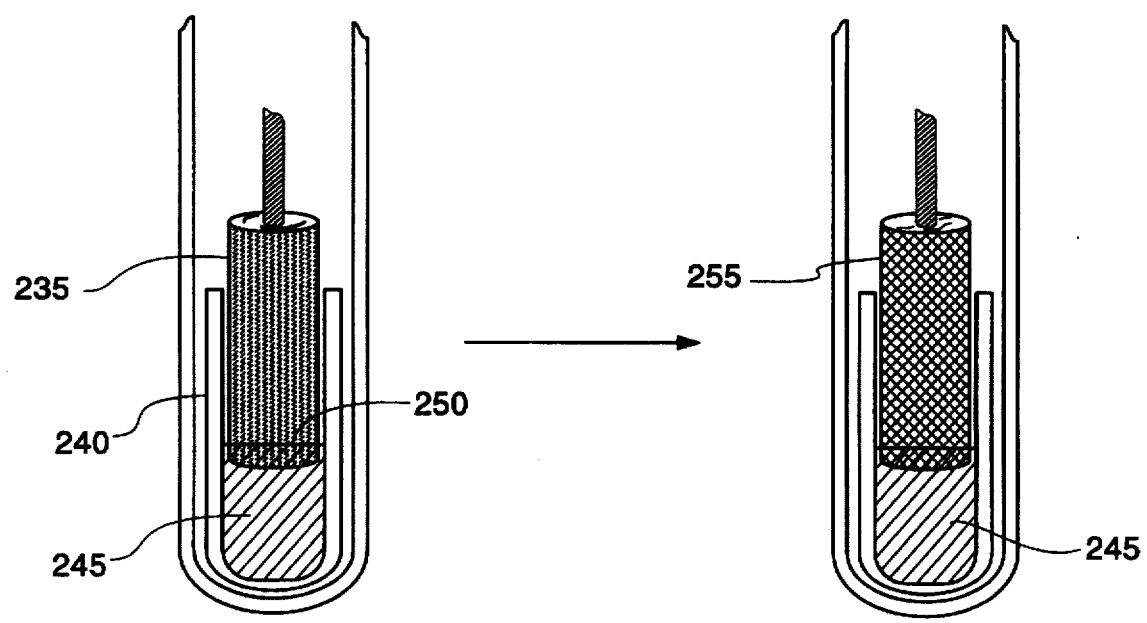
FIG. 3 illustrates an apparatus useful for carrying out a method according to one embodiment of the present invention.

An embodiment of this method is illustrated in FIGS. 2 and 3. Referring to FIG. 2, a ceramic tube 205 is provided having a lower end 210 that is closed and an upper end 215 that is open. The open upper end 215 is sealed, such as by using a teflon seal 220. A gas inlet/outlet 225 is provided such that gases can be extracted from or purged into the ceramic tube 205.

A ceramic control rod 230 extends through the seal 220 and is attached to a sintered ceramic body 235 having open and continuous porosity. The control rod 230 can be raised or lowered to control the vertical position of the sintered ceramic body 235 within the ceramic tube 205.

The lower end 210 of the ceramic tube 205 contains a refractory vessel 240. The lower end 210 is placed in a "hot zone" wherein heating means (not illustrated) can heat the lower end 210 to elevated temperatures. The refractory vessel 240 contains a quantity of molten metal 245 having an upper surface 250. Thus, the sintered ceramic body 235 can be lowered by the control rod 230 such that at least a portion of the sintered ceramic body 235 contacts the upper surface 250 of the molten metal 245.

Referring to FIG. 3, the hot zone is heated to a temperature of at least the melting temperature of the molten metal 245. Preferably, the sintered ceramic body 235 is in the hot zone for a sufficient amount of time that the sintered ceramic body 235 is heated to at least the melting temperature of the molten metal 245. A portion of the sintered ceramic body 235 is contacted with the top surface 250 of the molten metal 245. The molten metal 245 then infiltrates the entire sintered ceramic body 235 to form a ceramic-metal composite 255. Preferably, the amount of molten metal 245 available in the refractory vessel 240 to infiltrate the sintered ceramic body 235 is sufficient in quantity such that the sintered ceramic body 235 completely infiltrates without the top surface 250 lowering to a point below the portion of the sintered ceramic body 235 that is in contact with the molten metal 245.

The method according to this embodiment of the present invention also permits the composite to be formed in a very quick and efficient manner. For example, the infiltration time typically takes less than about 1 hour, preferably less than about 15 minutes and more preferably less than about 1 minute. For example, a 0.75 inch diameter cylinder of porous alumina can be infiltrated to a depth of 3 inches by copper metal in less than about 1 minute.

It is also preferable to heat the ceramic to at least the temperature of the molten metal. This is desirable since, if the ceramic is substantially cooler, the metal may cool and solidify upon infiltrating and contacting the ceramic matrix and thereby prevent further infiltration of the ceramic matrix by the metal.

The amount of infiltration into the ceramic matrix can be controlled by controlling the amount of time that the matrix is in contact with the molten pool. The desired amount of time will depend upon the ceramic matrix and metal being infiltrated, and the specific amount of time to infiltrate to a specific degree can be determined by routine experimentation.

Although the present invention is applicable to many combinations of matrix and infiltrant metals, it has been found particularly applicable to certain ceramic-metal composites. For example, in one preferred embodiment, copper is the infiltrant metal. As used herein, the term "copper metal" refers to any metal alloy that is predominantly copper, i.e., at least about 50 percent copper. Copper can be alloyed with a number of other elements, and in certain preferred embodiments discussed in detail below, copper can be alloyed with oxygen or titanium.

According to one preferred embodiment, the copper is infiltrated into a ceramic body that comprises a sintered ceramic oxide selected from the group of alumina, aluminum titanate, magnesium oxide and nickel oxide. In a more preferred embodiment, the ceramic matrix is alumina. Copper infiltrated alumina can advantageously provide high conductivity along with good hardness and strength provided by the ceramic matrix.

To improve the capillary action between the ceramic and the molten metal, it may be desirable to modify the wetting or spreading characteristics of the ceramic and metal. One way to do this is to coat the open porosity of the ceramic with a coating that is more easily wet by the molten metal. For instance, the interior surfaces of a sintered alumina ceramic can be modified by vapor phase coating, such as by chemical vapor deposition (CVD), the ceramic with copper oxide or nickel oxide to enhance the infiltration of copper metal.

Another way of enhancing the wetting characteristics is to modify the chemical composition of the molten metal with an infiltration additive. For instance, the wetting of molten copper on alumina can be enhanced by the addition of oxygen to the copper or with the addition of titanium (Ti). Such additions enhance the wetting and permit infiltration to occur rapidly and easily. When oxygen is added, it is preferred to add the oxygen to the copper metal in an amount of from about 1.5 weight percent to about 10 weight percent, more preferably from about 2 weight percent to about 5 weight percent. When titanium is used as an infiltration additive, it is preferably added in an amount of from about 1 weight percent to about 10 weight percent.

After one or more of the surface modifications and chemical alterations noted above, if necessary, the molten metal will wet the ceramic and infiltrate substantially all of the void space of the ceramic through capillary action.

In a preferred embodiment, the metal infiltration step is performed in a vacuum atmosphere. As used herein, vacuum atmosphere refers to an atmospheric pressure of about 10 millitorr or less. The evacuation of air from the ceramic void space reduces the likelihood that air pockets will be entrapped in the composite.

The ceramic-metal composites produced by the present invention have relatively high strengths and toughness. In one embodiment, a composite comprising about 65 percent alumina and about 35 percent copper/copper oxide has a compressive strength of at least about 110 ksi, as illustrated in FIG. 1.

The ceramic-metal composites which are produced in near-net shape according to the present invention are useful for many applications. For example, it is believed that the method can be used to fabricate articles of manufacture requiring a high degree of toughness and/or wear resistance.

For example, the present process is applicable to the manufacture of articles wherein it is difficult to control shrinkage of the article when the article is produced from a dense ceramic. Thus, intricate parts can be formed by injection molding and then can be underfired (a bisque fire), wherein the added ceramic body forms a sintered cohesive body without any substantial shrinkage of the body. Thereafter, the sintered cohesive body can be infiltrated according to the present invention. It has been found that such injection-molded and bisqued parts will be infiltrated throughout the composite regardless of the shape or intricacy of the article.

A variety of articles can be produced by the process according to this invention. These articles can include lock components (i.e., dead bolts, shackles, or any other part of a lock that should resist attempts to cut the component), door handles or other hardware that is subject to excessive wear, turbine blades that have an intricate shape, valve bodies used to enclose ball and seat valves, bearings, bushings, bearing races, gears, electrical contacts, seal faces, etc. Additional near net shapes are disclosed in co-pending application Ser. No. 08/220,557 now U.S. Pat. No. 5,503,122 which is generally directed to internal combustion engine components that can be fabricated according to a process of the present invention.

EXAMPLE 1

An alumina powder (CERALOX HPA, Ceralox Corp., Tucson, Ariz.) is obtained having an average particle size of about 1.0 micrometer. The alumina powder is formed into a green body by uniaxially pressing the powder at a pressure of about 50 MPa to obtain a green body having a porosity of about 55 percent.

The green body is then presintered in air at a temperature of about 1500° C. for about 3 minutes. The presintered body has an open porosity of about 35 volume percent.

The presintered body is then placed in a sintering furnace that comprises an alumina tube. The temperature of the furnace is raised as the furnace is evacuated. Before reaching about 800° C., the furnace is purged with argon gas to remove impurities in the furnace atmosphere. At about 800° C., the furnace is filled with HCl gas having a pressure of about 1 atm. The alumina body is then sintered under HCl gas at a temperature of about 1600° C. for about 80 minutes.

The sintered alumina ceramic has a total open porosity of about 35 volume percent and has an average pore size of about 3 micrometers. The alumina forms a continuous three-dimensional structure and there is substantially no closed porosity.

Thereafter, the alumina ceramic is contacted with a molten copper bath at a temperature of about 1275° C. The bottom surface of the alumina ceramic is contacted with the molten metal and the molten metal infiltrates through the alumina matrix via capillary action. The composite is then cooled. The composite comprises about 65 percent of a substantially continuous alumina phase and about 35 percent copper/copper oxide.

The stress strain diagram for the sample is illustrated in FIG. 1. The composite has a compressive strength of about 112 ksi.

EXAMPLE 2

To demonstrate the feasibility of infiltrating copper into aluminum titanate, two disks of a porous aluminum titanate material were obtained. The aluminum titanate disks had a porosity of about 20 volume percent and about 70 volume percent. Copper metal was contacted with the aluminum titanate disks and the assemblies were heated to about 1300° C. in air and infiltration occurred in about 20 minutes. Copper metal infiltrated the aluminum titanate and contained about 4.5 weight percent oxygen. The composite can be heated in a reducing atmosphere to reduce at least a portion of the copper oxide to copper.

EXAMPLE 3

Reaction bonded silicon nitride was infiltrated with 99.5 percent pure aluminum. Aluminum was contacted with a reaction bonded silicon nitride body and the assembly was heated in a vacuum furnace at 1100° C. for 60 minutes. A portion of the silicon nitride was infiltrated with aluminum. There was fracture of the infiltrated portion from the silicon nitride body due to the thermal expansion mismatch.

EXAMPLE 4

This example illustrates the infiltration of porous silicon nitride with a nickel-titanium alloy. A nickel-titanium alloy containing 10 weight percent titanium was placed in contact with a porous silicon nitride body and was heated in a vacuum furnace to a temperature of 1400° C. with a partial pressure of oxygen of about $10^{-8}$ atmospheres. The nickel-titanium alloy infiltrated the porous silicon nitride. Similar results are obtained by substituting chromium for titanium.

EXAMPLE 5

Alumina was infiltrated with a composition including 95 percent silver and 5 percent copper/copper oxide. The advantage of this composite is that the silver maintains a high ductility.

EXAMPLE 6

Aluminum having a purity of 99.5 percent was infiltrated into reaction bonded silicon carbide having silicon metal as a second phase. The system was maintained at 1100° C. for 60 minutes to insure complete mixing in the liquid state.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for making a near-net shape metal-infiltrated article of manufacture, comprising the steps of:
   (a) forming a sintered ceramic body having an outer surface and having at least about 5 volume percent open porosity, said sintered ceramic body having a general shape corresponding to a selected article of manufacture;
   (b) placing a metal having a melting temperature into a refractory vessel adapted to contain said metal;
   (c) heating said metal contained in said vessel to a temperature in excess of said melting temperature to form a pool of molten metal having a top surface;
   (d) contacting a portion of said sintered ceramic body with said top surface of said molten metal such that said molten metal spontaneously infiltrates substantially all of said open porosity in said sintered ceramic body wherein said sintered ceramic body is not substantially constrained on said outer surface; and
   (e) cooling said infiltrated ceramic body to form a metal-infiltrated article of manufacture.

2. A method as recited in claim 1, wherein said metal is copper metal.

3. A method as recited in claim 2, wherein said sintered ceramic body comprises alumina.

4. A method as recited in claim 2, wherein said copper metal comprises from about 1.5 weight percent to about 10 weight percent oxygen as an infiltration additive.

5. A method as recited in claim 2, wherein said copper metal comprises from about 1 weight percent to about 10 weight percent titanium as an infiltration additive.

6. A method as recited in claim 1, wherein said metal further comprises infiltration additives.

7. A method as recited in claim 1, wherein said sintered ceramic body comprises a substantially uniform sintered ceramic body without cavities.

8. A method as recited in claim 1, wherein said metal is selected from the group consisting of brass, bronze, copper metal, and nickel alloys.

9. A method as recited in claim 1, wherein said contacting step comprises contacting said sintered ceramic body with said molten metal for less than about 1 hour.

10. A method as recited in claim 1, wherein said contacting step comprises contacting said sintered ceramic body with said molten metal for less than about 15 minutes.

11. A method as recited in claim 1, wherein said contacting step occurs in the absence of substantial overpressure.

12. A method as recited in claim 1, wherein said contacting step occurs in a vacuum atmosphere.

13. A method as recited in claim 1, wherein said sintered ceramic body comprises from about 10 volume percent to about 90 volume percent open porosity.

14. A method as recited in claim 1, wherein said sintered ceramic body is formed by vapor phase sintering.

15. A method as recited in claim 1, wherein said forming step comprises injection molding a ceramic green body and bisque firing said green to form a cohesive sintered ceramic body.

16. A method for making a near-net shape ceramic-metal composite article of manufacture, comprising the steps of:
   (a) placing a metal having a melting temperature into a refractory vessel adapted to contain said metal;
   (b) heating said metal contained in said refractory vessel to a temperature of at least said melting temperature to form a molten metal;
   (c) contacting a sintered ceramic preform having a general shape corresponding to a desired article of manufacture and having from about 10 volume percent to about 90 volume percent open porosity with said molten metal under substantially no overpressure wherein capillary action wicks said molten metal into substantially all of said open porosity; and
   (d) cooling said infiltrated ceramic preform to form a ceramic-metal composite article of manufacture.

17. A method as recited in claim 16, wherein said article of manufacture is a lock component.

18. A method as recited in claim 16 wherein said article of manufacture is a turbine blade.

19. A method as recited in claim 16, wherein said sintered ceramic preform is heated to a temperature of at least about the temperature of said molten metal during said contacting step.

20. A method for making a near-net shape metal-infiltrated article of manufacture, comprising the steps of:
   (a) forming a sintered ceramic body having at least about 5 volume percent open porosity, said sintered ceramic body having a general shape corresponding to a selected article of manufacture;
   (b) placing a metal having a melting temperature into a refractory vessel adapted to contain said metal;
   (c) heating said metal contained in said vessel to a temperature in excess of said melting temperature to form a pool of molten metal having a top surface, wherein said molten metal comprises an infiltration additive comprising an oxide;
   (d) contacting a portion of said sintered ceramic body with said top surface of said molten metal such that said molten metal spontaneously infiltrates said open porosity in said sintered ceramic body; and
   (e) cooling said infiltrated ceramic body to form a metal-infiltrated article of manufacture.

21. A method as recited in claim 20, wherein said molten metal comprises copper and said oxide comprises copper oxide.

* * * * *